United States Patent
Coupe, II

[19]

[11] Patent Number: 6,014,052
[45] Date of Patent: Jan. 11, 2000

[54] IMPLEMENTATION OF SERIAL FUSIBLE LINKS

[75] Inventor: John R. Coupe, II, Ocala, Fla.

[73] Assignee: LSI Logic Corporation, Milpitas, Calif.

[21] Appl. No.: 08/939,942

[22] Filed: Sep. 29, 1997

[51] Int. Cl.[7] .................................................. G11C 7/00
[52] U.S. Cl. ........................ 327/525; 361/56; 365/225.7
[58] Field of Search ................................... 327/525, 526; 361/56, 91, 111, 58; 365/96, 225.7

[56] References Cited

U.S. PATENT DOCUMENTS

| | | | |
|---|---|---|---|
| 4,673,866 | 6/1987 | Masuda ................................... | 323/313 |
| 4,736,271 | 4/1988 | Mack et al. ............................... | 361/91 |
| 4,837,520 | 6/1989 | Golke et al. .............................. | 324/550 |
| 4,942,308 | 7/1990 | Conzelmann et al. ................ | 307/202.1 |
| 5,151,611 | 9/1992 | Rippey .................................. | 307/202.1 |
| 5,341,267 | 8/1994 | Whitten et al. ............................ | 361/56 |
| 5,384,727 | 1/1995 | Moyal et al. .............................. | 365/96 |
| 5,387,823 | 2/1995 | Ashizawa .................................. | 326/13 |
| 5,424,672 | 6/1995 | Cowles et al. .......................... | 327/525 |
| 5,508,638 | 4/1996 | Cowles et al. ............................. | 326/38 |

*Primary Examiner*—Terry D. Cunningham
*Assistant Examiner*—Eunja Adolphe

[57] ABSTRACT

In providing security for data within an integrated circuit, a plurality of fusible links are connected in series between a programming input/output pad and the integrated circuit into which protected data is written. The links are provided with separate input/output pads for individually blowing each link. Blowing any fusible link in the series prevents the programming input/output pad from being employed to alter or copy secured data within the integrated circuit. The failure rate of the security feature thus becomes a product of the fallout rates for each individual link, greatly reducing the overall failure rate.

13 Claims, 2 Drawing Sheets

IMPLEMENTATION OF SERIAL FUSIBLE LINKS

BACKGROUND OF THE INVENTION

1. Technical Field

The present invention relates generally to security features for integrated circuits and in particular to fusible links used to provide security for integrated circuits. Still more particularly, the present invention relates to an improved security feature for integrated circuits which employs fusible links.

2. Description of the Related Art

Integrated circuits frequently require security for data stored within the circuit such as, for example, an encryption key utilized to decipher or decode public signals like a satellite signal. Security features for integrated circuits generally either prevent data stored within the circuit from being read by an external means or prevent data from being written into the integrated circuit. Prior art mechanisms for providing security for integrated circuits include fusible links. Such devices are described, for example, in U.S. Pat. Nos. 5,270,983 and 5,309,394. Fusible links may take the form of metallic or polysilicon conductors within the integrated circuit having a narrow cross-section at a specific point. High current densities through the narrow region cause the conductor to melt and create a discontinuity in the conductor.

A prior art system for employing fusible links as a security feature is depicted in FIG. 3. Security circuit 302 includes a fusible link 304, which may be a polysilicon fusible link as described above. Input/output (I/O) pad 306 is connected to one end of fusible link 304 via signal line 308. Connected to signal line 308 is a diode connected transistor 310, arranged so that the equivalent diode cathode is connected to I/O pad 306 via signal line 308. The equivalent diode anode, the control electrode, of transistor 310 is connected to ground 312.

The other end of fusible link 304 is connected to diode connected transistor 314, which is arranged so that the equivalent diode anode is connected to fusible link 304 via signal line 316. The equivalent diode cathode of transistor 314 is connected to I/O pad 318.

Signal line 316 is also connected to pull-up resistor 320, which is connected at an opposite end to a power supply voltage, and to the input of inverter 322. The output 324 of inverter 322 is connected to a signal line within the integrated circuit (not shown) employing the fusible link as a security feature. For example, the output of inverter 322 may be connected to a WRITE-enable line within a memory.

In operation, I/O pad 306 may be utilized to control the signal line connected to inverter 322. To secure the integrated circuit, fusible link 304 is "blown" by connecting I/O pad 318 to ground and driving I/O pad 306 to a voltage of 8.5 V until the current at I/O pad 318 becomes zero. When the current at I/O pad 318 becomes zero, fusible link 304 has burned through and forms a discontinuity between signal lines 308 and 316. I/O pad 306 may thus no longer be utilized to control the signal line within the integrated circuit. Diode connected transistor 314 prevents I/O pad 318 from being utilized to control the signal line. I/O pads 306 and 318 may, however, be employed for other purposes via other connections (not shown).

Security cell 302 generally suffers a failure rate—cases in which fusible link 304 does not burn through when desired—of approximately 2 percent. For many applications, this fallout rate is unacceptable. Thus, the arrangement of security cell 302 is not attractive for integration as a security feature in such applications.

It would be desirable, therefore, to provide a security feature for integrated circuits having the benefits of the arrangement described. It would further be desirable if the failure rate were improved over the arrangement described.

SUMMARY OF THE INVENTION

In providing security for data within an integrated circuit, a plurality of fusible links are connected in series between a programming I/O pad and the integrated circuit into which protected data is written. The links are provided with separate I/O pads for individually blowing each link. Blowing any fusible link in the series prevents the programming I/O pad from being employed to alter or copy secured data within the integrated circuit. The failure rate of the security feature thus becomes a product of the fallout rates for each individual link, greatly reducing the overall failure rate.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
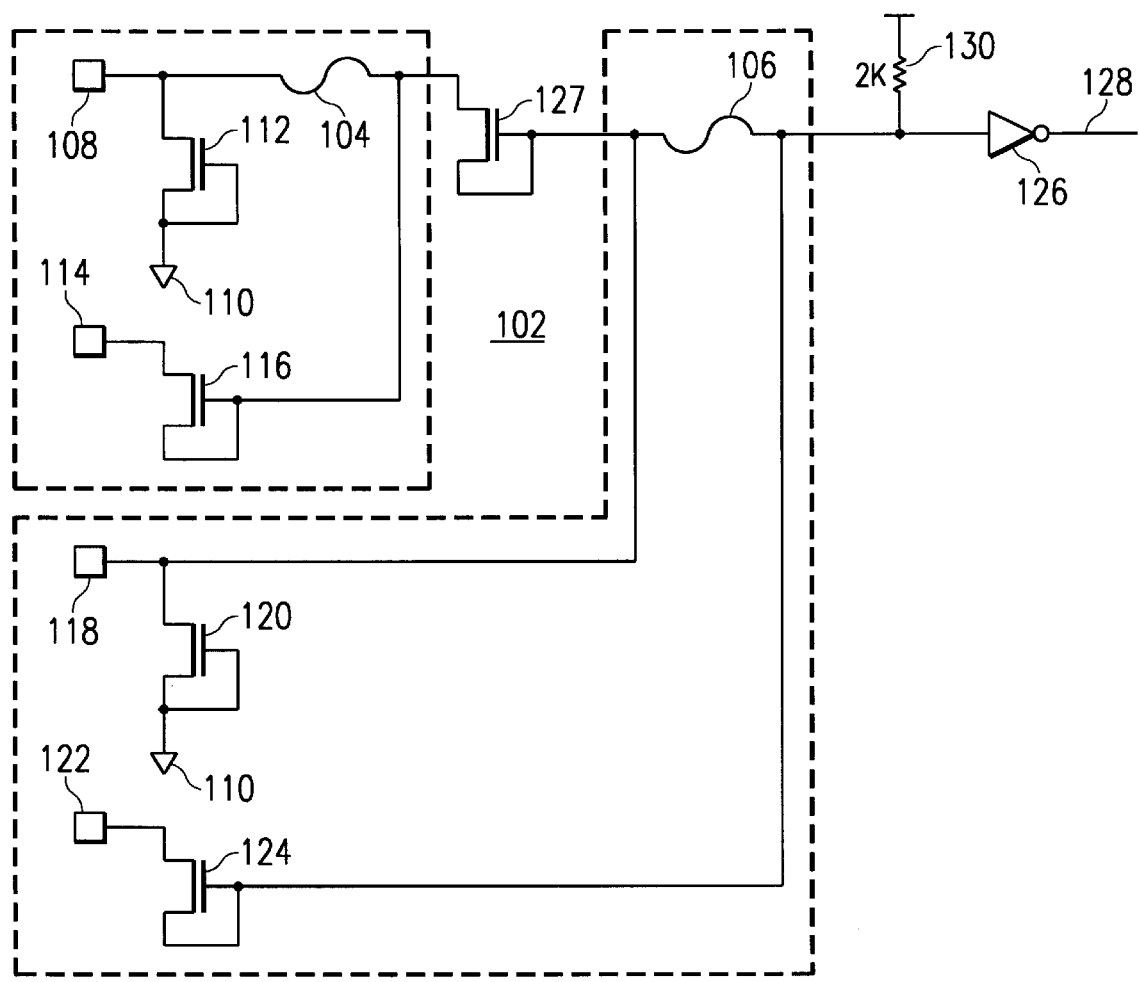
FIG. 1 depicts a circuit diagram for an I/O security circuit in accordance with a preferred embodiment of the present invention.

With reference now to the figures, and in particular with reference to FIG. 1, a circuit diagram for an I/O security circuit in accordance with a preferred embodiment of the present invention is depicted. The security circuit depicted may be formed within the same die containing the secured integrated circuit. Security circuit 102 includes a plurality of fusible links 104 and 106 connected in series, in a wired-OR configuration. Fusible links 104 and 106 are connected to separate I/O pads for programming, forming a plurality of series-connected security cells with the output of one security cell connected to the input of a subsequent security cell. Link 104 is connected at one end to I/O pad 108, which is connected to ground 110 through diode connected transistor 112. At the other end, link 104 is connected to I/O pad 114 through diode connected transistor 116. Fusible link 106 is connected at one end to I/O pad 118, which is connected to ground 110 through diode connected transistor 120. At the other end, link 106 is connected to I/O pad 122 through diode connected transistor 124.

Links 104 and 106 are connected in series, through diode connected transistor 127 in the depicted example. The series-connected links 104 and 106 are connected through inverter 126 to signal line 128 to the secured integrated circuit. Pullup resistor 130 connects the input of inverter 126 to a power supply voltage.

In operation, I/O pad 108 may be utilized to program the integrated circuit. I/O pad 118 may not be utilized to program the integrated circuit due to diode connected transistor 127. Once programming is complete, links 104 and 106 are blown. To blow link 104, I/O pads 114, 118, and 122 are grounded and I/O pad 108 is driven at 8.5 V until the current at I/O pad 118 goes to zero, indicating that fusible link 104 has burned through.

To fusible link 106, I/O pad may be allowed to float, I/O pad 122 is grounded, I/O pads 114 and 118 are driven at 8.5 V until the current at I/O pad 122 goes to zero, indicating that fusible link 106 has burned through.

Because the fusible links are implemented in series, the failure rate is greatly reduced. Failure may occur at either fusible link 104 or 106. However, since the two links are connected in series between I/O pad 108 and the secured integrated circuit, successfully blowing either fusible link 104 or 106 effectively prevents I/O pad 108 from being utilized to alter or copy data within the integrated circuit. Additional links may also be added, further reducing the failure rate. For n fuses having an individual fallout rate of 2 percent and connected in series between the programming I/O pad and the secured integrated circuit, the failure rate is given by $0.02^n$. Thus, a two fuse arrangement experiences a 0.04 percent fallout rate, a three fuse arrangement suffers a 0.0008 percent fallout rate, etc. Two fusible links are preferable since the failure rate is acceptable for virtually all applications and adding I/O pads for additional links requires space in the secured integrated circuit.

Although depicted in the exemplary embodiment with separate pairs of I/O pads for each fusible link in the security feature, the present invention may be practiced with other arrangements of I/O pads. Additionally, the I/O pads may be employed for other purposes after the fusible links are blown via other connections (not shown).

Figure 2:
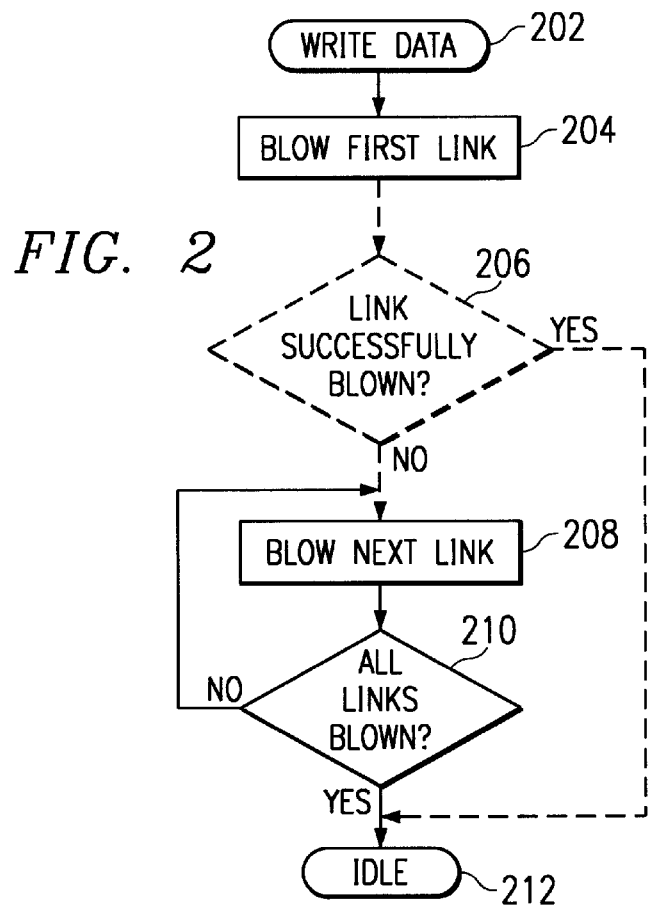
FIG. 2 is a high level flowchart for a process of utilizing a security feature within an integrated circuit in accordance with a preferred embodiment of the present invention.
Figure 3:
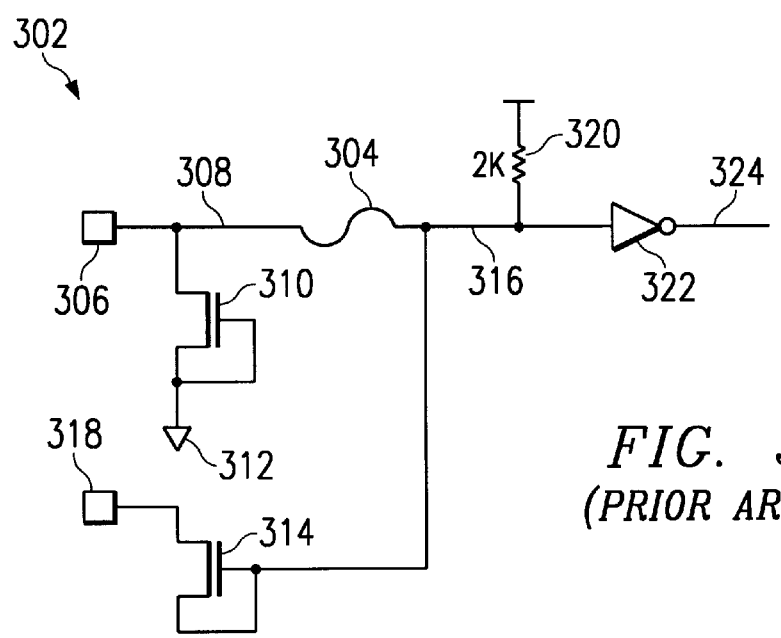
FIG. 3 depicts a circuit diagram for a prior art security circuit.

Referring now to FIG. 2, a high level flowchart for a process of utilizing a security feature within an integrated circuit in accordance with a preferred embodiment of the present invention is illustrated. The process begins at step 202, which depicts writing the secured data to the integrated circuit for the exemplary embodiment. Once the data is written, the first fusible link in the series is blown (step 204).

The process may optionally branch (step 206) depending on whether the link was successfully blown. A determination of whether the link was successfully blown may be made, for example, by the inability of current to pass through the link. If the first link is successfully blown, no need exists to blow the remaining links. In a preferred embodiment, however, the remaining links are blown (steps 208 and 210) regardless of whether the first link is successfully blown.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. In an integrated circuit, a circuit comprising:
   first and second pads; and
   first and second fuses connected in series between the first pad and a signal line and between the first and second pads,
   wherein the first and second fuses may be independently blown to prevent the use of the pads to alter or copy data within the circuit.

2. The circuit of claim 1, further comprising:
   a resistor connected between the signal line and a reference voltage terminal.

3. In an integrated circuit, a circuit comprising:
   first and second pads;
   first and second fuses connected in series between the first pad and a signal line and between the first and second pads; and
   a diode connected between the first pad and a reference voltage terminal.

4. In an integrated circuit, a circuit comprising:
   first and second pads;
   first and second fuses connected in series between the first pad and a signal line and between the first and second pads; and
   a diode connected between the signal line and the second pad, wherein the diode is connected in series with the first and second fuses between the first and second pads with an anode connected to the first and second fuses.

5. The circuit of claim 4, further comprising:
   a third pad connected to the first fuse, wherein the first fuse is connected in series between the first and third pads.

6. In an integrated circuit, a circuit comprising:
   first and second pads;
   first and second fuses connected in series between the first pad and a signal line and between the first and second pads;
   a first diode connected between the signal line and the second pad, wherein the first diode is connected in series with the first and second fuses between the first and second pads with an anode connected to the first and second fuses;
   a third pad connected to the first fuse, wherein the first fuse is connected in series between the first and third pads;
   a second diode connected between the first fuse and the third pad with an anode connected to the first fuse;
   a third diode connected between the first and second fuses with an anode connected to the second fuse; and
   a fourth pad connected to the second fuse, wherein the second fuse is connected in series between the second and fourth pads.

7. The circuit of claim 6, further comprising:
   a resistor connected between the signal line and a reference voltage terminal.

8. The circuit of claim 6, further comprising:
   a fourth diode connected between the first pad and a reference voltage terminal, a cathode of the fourth diode connected to the first pad.

9. The circuit of claim 6, further comprising:
   a fourth diode connected between the fourth pad and a reference voltage terminal, a cathode of the fourth diode connected to the fourth pad.

10. A security feature for an integrated circuit, comprising:
    a plurality of security cells connected in series between an input signal and a signal line to the integrated circuit, wherein each security cell within the plurality of security cells further comprises:
    a fusible link;
    a first pad connected to a first terminal of the fusible link; and
    a diode connected between a second terminal of the fusible link and a second pad.

11. The security feature of claim 10, wherein a first security cell within the plurality of security cells connected in series receives the input signal at a first pad of the first security cell, and wherein a last security cell within the plurality of security cells connected in series is connected to the signal line to the integrated circuit at a second terminal of a fusible link within the last security cell.

12. The security feature of claim 10, wherein each security cell within the plurality of security cells further comprises:

a diode connected between a first pad and a reference voltage.

13. A security feature for an integrated circuit, comprising:

a plurality of security cells connected in series between an input signal and a signal line to the integrated circuit, wherein each security cell within the plurality of security cells further comprises:

(1) a fusible link;

(2) a first pad connected to a first terminal of the fusible link; and (3) a diode connected between a second terminal of the fusible link and a second pad; and a diode connected between each pair of security cells within the series of security cells connected to the signal line, an anode of the diode connected to an input for a first security cell and a cathode of the diode connected to an output for a second security cell.

\* \* \* \* \*